(12) United States Patent
Sanga et al.

(10) Patent No.: US 9,048,405 B2
(45) Date of Patent: Jun. 2, 2015

(54) LIGHT EMITTING DEVICE

(71) Applicant: Nichia Corporation, Anan-shi, Tokushima (JP)

(72) Inventors: Daisuke Sanga, Tokushima (JP); Takuya Okada, Tokushima (JP); Keisuke Sejiki, Tokushima (JP); Kunihito Sugimoto, Anan (JP); Takao Kosugi, Anan (JP); Dai Wakamatsu, Itano-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/133,920

(22) Filed: Dec. 19, 2013

(65) Prior Publication Data

US 2014/0175491 A1 Jun. 26, 2014

(30) Foreign Application Priority Data

Dec. 25, 2012 (JP) ................. 2012-281393

(51) Int. Cl.
*H01L 33/60* (2010.01)
*H01L 33/50* (2010.01)
H01L 25/075 (2006.01)
H01L 33/44 (2010.01)

(52) U.S. Cl.
CPC ............. *H01L 33/60* (2013.01); *H01L 25/0753* (2013.01); *H01L 33/44* (2013.01); *H01L 33/505* (2013.01)

(58) Field of Classification Search
None
See application file for complete search history.

(56) References Cited

U.S. PATENT DOCUMENTS

| 7,071,616 | B2 * | 7/2006 | Shimizu et al. ............... 313/506 |
| 2009/0045416 | A1 | 2/2009 | Bierhuizen et al. |
| 2011/0210369 | A1 | 9/2011 | Daicho et al. |
| 2012/0104452 | A1 | 5/2012 | Miyoshi et al. |

FOREIGN PATENT DOCUMENTS

| JP | 2008-235566 A | 10/2008 |
| JP | 2010-537400 A | 12/2010 |
| JP | 2012-099545 A | 5/2012 |
| WO | WO 2010/044240 A1 | 4/2010 |

* cited by examiner

*Primary Examiner* — Robert Carpenter
(74) *Attorney, Agent, or Firm* — Squire Patton Boggs (US) LLP

(57) ABSTRACT

The light emitting device comprising a light emitting element; and a wavelength converting member having a first face and a second face, in which light emitted from the light emitting element enters in through the first face, and a part of the second face serves as a light emitting face, wherein the light emitting element further comprises a reflection control structure around the light emitting face of the second face, and the reflection control structure comprises a reflection film on the wavelength converting member and an anti-reflection film on the reflection film.

14 Claims, 2 Drawing Sheets

LIGHT EMITTING DEVICE

BACKGROUND OF THE INVENTION

1. Field of the Invention

The present invention relates to a light emitting device that is applicable to display devices, illumination devices, displays, backlight sources of liquid crystal displays, light sources for vehicles and the like, and to a method for manufacturing the same. In particular, the present invention relates to a high-brightness light emitting device used for light sources of vehicles, and a method for manufacturing the same.

2. Description of the Related Art

In recent years, light emitting devices with a light emitting element such as light emitting diode have been getting popular as light sources of vehicle lamps. As disclosed in WO 2010/044240 A, an example of such light emitting devices for vehicle lamp units includes a phosphor-containing wavelength converting member on its light emitting element. In order to obtain high brightness, a metal film is formed on a part of the surface of the wavelength converting member to reduce the light emitting area and to increase the amount of light per unit area. The reduced light emitting area is also advantageous in terms of reducing the size of the vehicle lamp.

Further, in a light emitting device disclosed in JP 2012-99544 A, a wavelength converting member containing a phosphor is placed on a light emitting element that is face-down mounted on a substrate, wherein a reflection resin is provided around the circumferences of the light emitting element and the wavelength converting member to cover the side faces of the light emitting element and wavelength converting member. With the reflection resin, the light emitted from the light emitting element and wavelength converting member emits from a light emitting face that is not covered with the reflector resin. The reflector resin reflects the light emitted from the side faces of the light emitting element and wavelength converting member to turn the light toward the light emitting face, thus allowing for high brightness of the light emitting device.

However, if such a conventional light device is incorporated in a vehicle lamp, light emitted from the light emitting device is reflected on the surfaces of a reflector provided around the light emitting device, peripheral light reflective members and the like, and the reflected light is further reflected on the surface of the wavelength converting member of the light emitting device at the part not facing the light emitting face. The resulting reflected light mixes with the light from the light emitting face, and is eventually emitted as a part of the light from the light emitting device. This changes the luminous intensity distribution of the light emitting device when it is incorporated in a vehicle lamp. As a result, there has been a problem of difficulty in obtaining desired luminous intensity distribution of an assembled vehicle lamp.

Furthermore, the light is apparently emitted from not only the intended light emitting face but also from the surrounding part of the defined light emitting face. Since this degrades the visibility of the light emitting face (makes the outline unclear) although the light emitting face is narrowed down, there has been another problem of difficulty in sufficiently reducing the light emitting area.

SUMMARY OF THE INVENTION

Therefore, it is a first object of the present invention to provide a light emitting device which offers less change of the luminous intensity distribution even when it is incorporated in a vehicle lamp.

Further, it is a second object of the present invention to provide a light emitting device whose light emitting area can be reduced and whose light emitting face has a sharp outline.

To solve the above-mentioned problems, a light emitting device of the present invention includes:

a light emitting element; and a wavelength converting member including a first face and a second face, wherein light emitted from the light emitting element enters in through the first face, and a part of the second face serves as a light emitting face, wherein the light emitting element further includes a reflection control structure around the light emitting face of the second face, and the reflection control structure includes a reflection film on the wavelength converting member and an anti-reflection film on the reflection film.

Since the light emitting element of the present invention with the above-mentioned structure includes the anti-reflection film around the light emitting face, it offers less change of the luminous intensity distribution even when it is incorporated in, for example, a vehicle lamp.

Furthermore, since the light emitting device of the present invention includes the reflection control structure around the light emitting face, the light emitting area can be decreased, and the anti-reflection film of the reflection control structure allows for the sharp outline of the light emitting face.

DETAILED DESCRIPTION OF THE EMBODIMENTS

Preferred embodiments of the present invention will be described below with reference to the accompanying drawings. The drawings are merely schematic views, and the positions, dimensions, proportions, shapes and the like illustrated therein may be different from the actual ones. Among the embodiments, identical reference signs designate identical or corresponding members, and the description thereof may be omitted.

As used herein, the terms "up" and "down (low)" sometimes refer to the light emitting side and the opposite side thereof of a light emitting device respectively. For example, the term "upward" refers to the light emitting direction of a light emitting device, and the term "downward" refers to the opposite direction thereof. Further, the term "upper face" refers to the face on the light emitting side of a light emitting device, and the term "lower face" refers to the face on the opposite side thereof.

EMBODIMENTS

Figure 1:
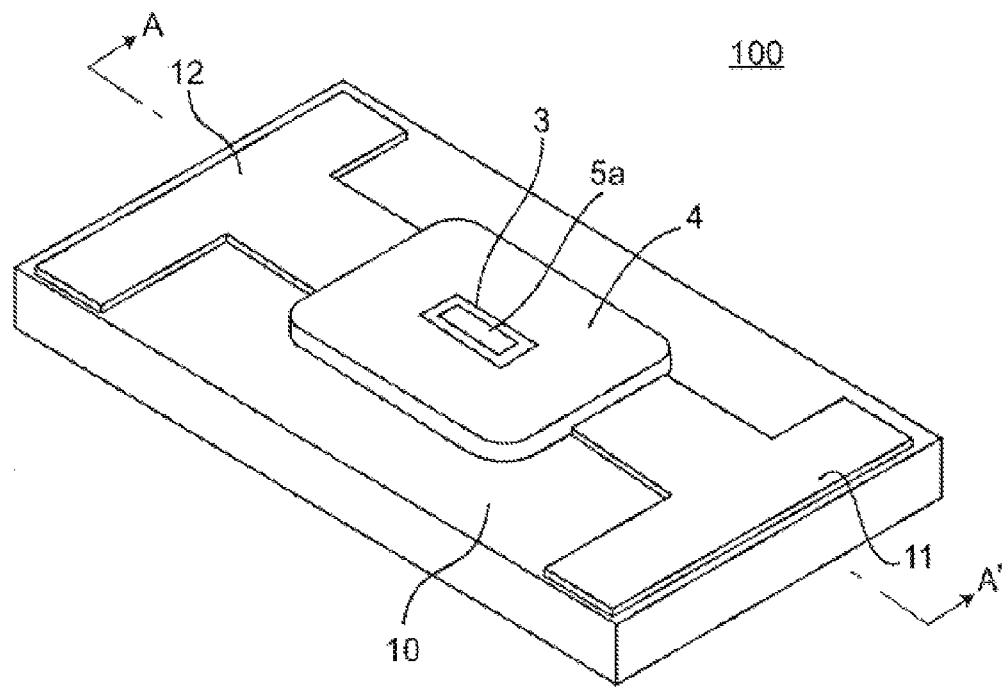
FIG. 1 is a perspective view of a light emitting device 100 of the present invention.
Figure 2:
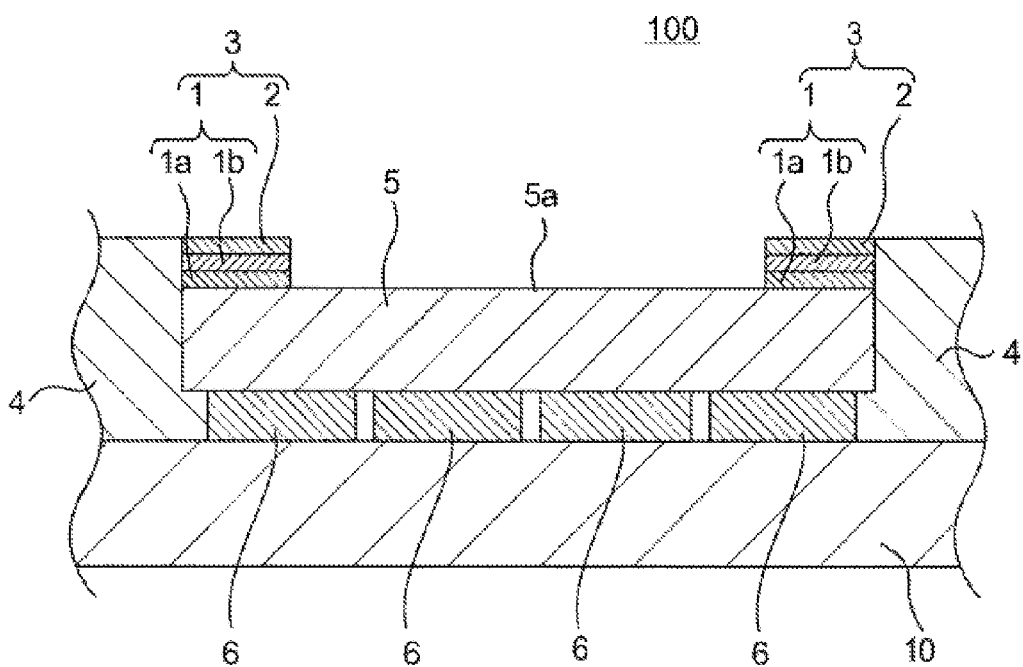
FIG. 2 is a cross sectional view of the light emitting device of FIG. 1, taken along lines A-A.

FIG. 1 is a perspective view illustrating the structure of a light emitting device 100 according to a first embodiment of the present invention, and FIG. 2 is a schematic cross sectional view taken along lines A-A' of FIG. 1. As illustrated in FIG. 1 and the like, the light emitting device 100 includes a substrate 10, and further includes a light emitting element 6, a wavelength converting member 5 on the upper face of the light emitting element 6, and a light reflecting resin 4 that is placed covering the side faces of the light emitting element 6 and wavelength converting member 5, which are provided on the substrate 10. The light emitting element 6 is, for example, a blue light emitting diode, and necessary pieces (one or two or more) are provided according to a required luminous intensity. The wavelength converting member 5 is made of, for example, a transparent material in which phosphor particles such as YAG are dispersed, and is excited by the light (e.g. blue light) of the light emitting element 6 to emit yellow light.

In the light emitting device of the embodiment, a reflection control structure 3 is formed on the upper face of the wavelength converting member 5 along the circumference of the wavelength converting member 5, so as to decrease the area of a light emitting face 5a to enhance the brightness. The reflection control structure 3 includes a reflection film on the wavelength converting member 5 and an anti-reflection film 2 on the reflection film 1. As illustrated in FIG. 1, the reflection film 1 may further include a first reflection film 1a on the wavelength converting member 5 and a second reflection film 1b on the first reflection film 1a.

In the light emitting device 100 of the embodiment with the above-mentioned structure, the light emitting face 5a corresponds to the exposed part of the upper face of the wavelength converting member 5 that is surrounded by the reflection control structure 3, and for example, white light is emitted from the light emitting face 5a.

In FIG. 1, the members denoted by reference signs 11 and 12 are electrodes made of, for example, metal film.

The light emitting operation of the light emitting element 100 will be described below. In the following description, the light emitting element 6 is a blue light emitting diode, and the phosphor particles dispersed in the wavelength converting member 5 are excited by blue light to emit yellow light.

In the light emitting device 100 of the embodiment, the light emitting element 6 is powered through the electrodes 11 and 12 so that blue light is emitted from the light emitting element 6. The light emitted from the light emitting element 6 is partly absorbed in the phosphor particles contained in the wavelength converting member 5 to excite the phosphor particles, while the other part is emitted from the light emitting face 5a without being absorbed by the phosphor particles contained in the wavelength converting member 5. The phosphor particles excited by the blue light emit yellow light, and this light emitted from the phosphor particles is emitted from the light emitting face 5a. The wavelength converting member 5 is covered with a reflective material (either reflection control structure 3 or light reflecting resin 4) except for its lower face, i.e. the incident face, and the light emitting face 5a. Therefore, the blue light and yellow light inside the wavelength converting member 5 is emitted from the light emitting face directly or after being reflected inside the wavelength converting member 5 for one or plural times.

In this way, the blue light of the light emitting element 6 and the yellow light of the phosphor particles are mixed with each other to be white mixed light, and are emitted from the light emitting face 5a of the wavelength converting member 5.

The light emitting device of the embodiment with the above-mentioned structure is incorporated in, for example, vehicle lamps that require certain luminous intensity distribution. The internal structure of a vehicle lamp is determined according to the light emitting properties (including the luminous intensity distribution) of its light emitting device so as to satisfy required luminous intensity distribution for the vehicle lamp. With the light emitting device of the present invention, desired luminous intensity distribution is readily obtained.

That is, when the light emitting element is incorporated in a vehicle lamp, light emitted from the light emitting device is reflected on a reflector provided around the light emitting device, peripheral light reflective members and the like to be irradiated on the light emitting device. In conventional light emitting devices, the light irradiated on the light emitting device is reflected on the periphery of the light emitting face to interfere with the light emitted from the light emitting face. This changes the luminous intensity distribution of the light emitting device, and eventually results in deviation from designed luminous intensity distribution of the vehicle lamp. In this way, such light reflection near the light emitting face makes it difficult to obtain desired luminous intensity distribution of the assembled vehicle lamp.

However, in the light emitting device of the embodiment, the light emitted from the light emitting face do not interfere with light reflected around the light emitting face, since it is provided with the reflection control structure 3 around the light emitting face 5a and the anti-reflection film 2 is provided on the surface of the reflection control structure 3. Therefore, even if light is irradiated on the light emitting device, the luminous intensity distribution of the light emitting device changes less, which results in less change of the luminous intensity distribution of the vehicle lamp. As a result, this allows for obtaining desired and designed luminous intensity distribution of the assembled vehicle lamp. Desired luminous intensity distribution is thus readily obtained.

Furthermore, the light emitting device of the embodiment does not apparently emit light from the periphery of the light emitting face. Therefore, the light emitting face has a clear outline, and the light emitting area can be sufficiently reduced.

Each component of the light emitting device 100 of the embodiment will be described below.

(Substrate 10)

Examples of the substrate 10 include substrates of insulating material such as glass epoxy, resin and ceramics. A metal plate, on which the electrodes 11 and 12 are formed through an insulating material, may also be used. The substrate 10 is preferably a flat plate.

For high brightness light emitting devices, it is preferred the substrate 10 is made of ceramics that have high heat resistance and high weatherability, and high thermal conductivity as well. Such ceramics materials include alumina, aluminum nitride, mullite and the like. In order to effectively dissipate heat generated by the light emitting element 6, it is preferred that the substrate 10 has, for example, a thermal conductivity of 150 W/m·K or more.

(Light Emitting Element 6)

The light emitting element 6 is preferably a light emitting diode. For example, blue or green light emitting elements include those using ZnSe, a nitride semiconductor ($In_XAl_YGa_{1-X-Y}N$, $0 \leq X$, $0 \leq Y$, $X+Y \leq 1$) or GaP. Red light emitting elements include those using GaAlAs, AlInGaP or the like. Further, light emitting elements made of other materials may also be used. The composition, emission color, size, number of pieces and the like of the light emitting element to be used may be suitably selected according to the purpose. In the embodiment that employs the wavelength converting member 5 containing dispersed phosphor particles, it is preferred to use a nitride semiconductor ($In_XAl_YGa_{1-X-Y}N$, $0 \leq X$, $0 \leq Y$, $X+Y \leq 1$), which can emit short wavelength light that can effectively excite the phosphor particles. The emission wavelength of a compound semiconductor light emitting element can be selected from a wide range by changing the material of its semiconductor layer and the proportions of its mixed crystal.

(Wavelength Converting Member 5)

The wavelength converting member 5 includes a substrate transparent material and the phosphor particles dispersed in the transparent material. The phosphor particles absorb the light emitted by the light emitting element 6 to emit light at a wavelength different from that of the absorbed light. The substrate transparent material may be, for example, glass material or transparent ceramics material. The thickness of the wavelength converting member 5 is not particularly limited and may be suitably set and is, for example, from approximately 50 μm to 300 μm. Typical phosphors that can be used for the wavelength converting member so as to make a suitable combination with a blue light emitting element to produce white mixed light emission include, for example, yttrium aluminum garnet (YAG)-based phosphors, barium ortho-silicate (BOS)-based phosphors and the like. To manufacture a light emitting device that can emit white light, the color is adjusted to white by changing the amount of the phosphor particles dispersed in the wavelength converting member 5.

(Reflection Control Structure 3)

The reflection control structure 3 includes the reflection film 1 formed on the wavelength converting member and the anti-reflection film 2 formed on the reflection film 1. It is preferred that the reflection film 1 is a laminate including a first reflection film 1a that is, for example, a multilayer film (dielectric multilayer) composed of high refractive index dielectric films and low refractive index dielectric films and a second reflection film 1b that is, for example, a metal film having a high reflectivity. A dielectric multilayer can be made to have a high reflectivity at a certain wavelength or within a certain wavelength range by setting the refractive index difference between the high refractive index dielectric films and the low refractive index dielectric films and the thickness of each layer according to an intended reflectivity. Examples of high refractive index materials for the dielectric multilayer include $Nb_2O_5$, $TiO_2$, $ZrO_2$, $Ta_2O_3$, $HfO_2$ and the like, and examples of low refractive index materials include $SiO_2$, $Al_2O_3$, $MgF_2$ and the like.

Because a dielectric multilayer can be made to have a low light absorption as well as a high reflectivity, it is suitable for the first reflection layer 1a formed on the wavelength converting member 5. The reflectivity of a dielectric multilayer can be increased by making the refractive index difference between the high refractive index dielectric films and the low refractive index dielectric films larger or by increasing the number of lamination of the high refractive index dielectric films and low refractive index dielectric films. Because the reflectivity of the first reflection film 1a made of a dielectric multilayer is dependent on the incident angle, the film thickness and refractive index of each dielectric film is set so that blue light is effectively reflected by the first reflection film 1a, which is considered to dominantly have a vertical incident angle (most of which is considered to enter to the reflection film at an vertical angle or an approximately vertical angle).

In contrast, the second reflection layer 1b is made of metal film having a high reflectivity, and the reflectivity thereof is comparatively less dependent on wavelength and incident angle. Accordingly, it reflects the light that passed through the first reflection film 1a without being reflected. When the first reflection layer 1a is made to effectively reflect blue light, the second reflection layer 1b reflects light at a longer wavelength than blue light, including yellow light.

Examples of highly reflective metal materials for the second reflection layer 1b include Ag, Ag alloys, Al, Al alloys, Rh, Au, Cu and the like.

As mentioned above, the lamination structure of the reflection film 1 including the first reflection layer 1a and the second reflection layer 1b allows for effectively reflecting light in any direction and at a wavelength within a wide range The anti-reflection film 2 may be made of, for example, dark metal that absorbs light, such as Ni, Cr, $Cr_2O_3$, Fe, Nb and Ti.

Regarding the forming method, these reflection films and anti-reflection film may be formed by sputtering, vapor deposition or plating. They may be formed on the plate wavelength converting member 5 in a desired pattern by using a mask such as metal mask having a predetermined shape.

(Light Reflecting Resin 4)

In the embodiment, the light reflecting resin 4 covers side faces of the light emitting element 6 and side faces of the wavelength converting member 5. Specifically, it is formed in a frame shape that surrounds the circumferences of the light emitting element 6 and wavelength converting member 5.

The light reflecting resin 4 may be prepared by adding a reflection substance to a substrate resin such as a silicone resin, a modified silicone resin, an epoxy resin, a modified epoxy resin, an acrylic resin and a hybrid resin containing at least one of them. The material of the reflection substance may be an oxide containing any of Ti, Zr, Nb, Al and Si, or AlN, MgF or the like. Titanium oxide ($TiO_2$) is preferably used. It is preferred that the reflection substance are particles that have a refractive index different from that of the substrate material and are dispersed in the substrate material. Since the rate of reflection or transmission of light varies depending on the concentration or density of the reflection substance, the concentration or density may be suitably adjusted according to the shape and size of the light emitting device.

(Manufacturing Method)

A manufacturing method of the light emitting device 100 of the embodiment will be described below.

(Manufacture of Reflection Control Structure 3)

For example, a large wavelength converting member plate is prepared by sintering glass material mixed with YAG phosphor particles. The large wavelength converting member plate is a large area plate of a wavelength converting member for preparing a plurality of the wavelength converting members 5 in a unified state at once.

After the surface (the second face) of the wavelength converting member is covered by a resist mask except for the portion where the reflection film and anti-reflection film are formed but including the portion where the light emitting face 5a is defined, the reflection film and anti reflection film of the reflection control structure 3 are formed by sputtering or vapor deposition. After the film coating, the resist mask is removed. Then, the large wavelength converting member plate was cut into a desired size and shape. The wavelength converting member is thus formed.

(Preparation of Substrate 10)

The substrate 10 provided with the pair of positive and negative electrodes 11 and 12 are prepared.

(Mounting and Assembling)

In the embodiment, the electrodes 11 and 12 are formed, for example, in a pattern with which a plurality (e.g. four pieces) of flip-chip mounted light emitting elements 6 are connected in series (not shown).

Then, the light emitting element 6 is flip-chip mounted on the electrodes by bumps.

Then, the wavelength converting member 5 is bonded on the flip-chip mounted light emitting element 6. The light emitting element 6 and the wavelength converting member 5 are bonded with each other by an adhesive (not shown). It is preferred that the adhesive is made of material that can guide light emitted from the light emitting element 6 to the wavelength converting member 5, for example, transparent adhesive material such as silicon resin.

Then, the light reflecting resin 4 is formed surrounding the light emitting element 6 in a frame shape.

The light reflecting resin 4 is formed to cover at least the side face of the wavelength converting member 5 and the side face of the reflection control structure 3.

In this way, the light emitting device is manufactured in which the wavelength converting member 5 is covered with the reflective members (either reflection control structure 3 or light reflecting resin 4) except for the lower face that serves as an incident face and the light emitting face 5a, and the surface around the light emitting face 5a is covered with the anti-reflection film 2.

Figure 3:
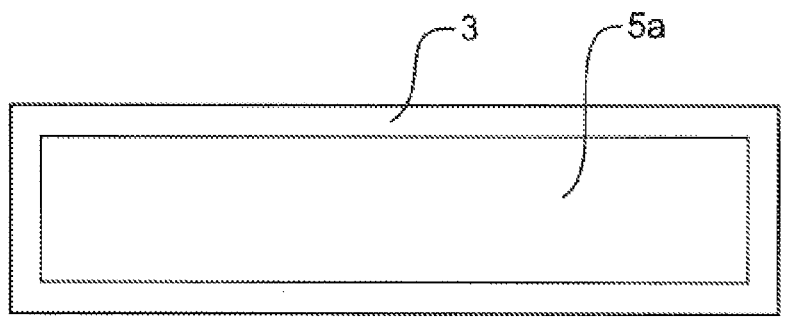
FIG. 3 is an enlarged view of a light emitting face of the light emitting device of FIG. 1.
Figure 4:
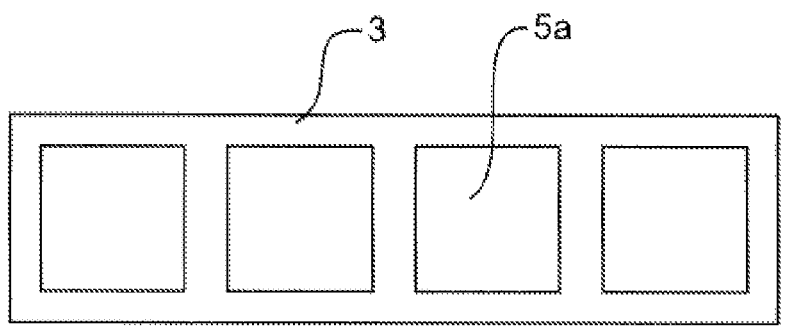
FIG. 4 is an enlarged view of a light emitting face of a variation of the light emitting device of the present invention.

In the above-mentioned embodiment, the single light emitting face 5a is formed on the upper face of the wavelength converting member 5 as illustrated in FIG. 3. However, the present invention is not limited thereto, and a plurality of the light emitting faces 5a may be formed on the upper face of the wavelength converting member 5 as illustrated in FIG. 4. Further, the shape of the light emitting face is not limited to a rectangular shape, but may be various shapes.

EXAMPLES

Example 1

A large YAG plate is formed by sintering a glass material mixed with a YAG phosphor. First, the surface of the large YAG plate is covered by a resist mask except for the portion where a reflection film 1 and an anti-reflection film 2 are formed but including the portion where a light emitting face 5a is defined. Thereafter, a 0.3 µm thick Al film is formed by using a sputtering device as the reflection film 1, and then a 0.3 µm Ti film is further formed by using a sputtering device as the anti-reflection film 2. The reflection film 1 and anti-reflection film 2 are thus formed. Then, the resist mask is removed, and the large YAG plate is diced in the longitudinal direction and the cross direction to form rectangular wavelength converting members 5 of a desired size.

After four pieces of light emitting elements 6 are face-down mounted in a line on a substrate with a wiring pattern, the above-mentioned wavelength converting member 5 are fixed on the four light emitting elements 6 by an adhesive.

A reflection resin containing titanium dioxide is placed along the circumferences of the light emitting elements 6 and the wavelength converting member 5 so as to cover the side faces of the light emitting elements 6 and the wavelength converting member 5.

Example 2

On a large YAG plate prepared in the same manner as in Example 1, a 4.4 µm thick dielectric multilayer film of $SiO_2$/$Nb_2O_5$ is formed by using a sputtering device as the first reflection film 1a, then a 0.3 µm thick Al film is formed by using a sputtering device as the second reflection film 1b, and then 0.3 µm thick Ti film is further formed by using a sputtering device as the anti-reflection film 2. The reflection film 1 and the anti-reflection film 2 are thus formed.

Other than the above, a light emitting device is prepared in the same manner as in Example 1.

Example 3

On a large YAG plate prepared in the same manner as in Example 1, a 4.0 µm thick dielectric multilayer film of $SiO_2$/$Nb_2O_5$ is formed by using a sputtering device as the first reflection film 1a, then a 0.3 µm thick Au film is formed by using a sputtering device as the second reflection layer 1b that mainly reflects light at 500 nm or more, then a 0.2 µm thick Pt film is formed by using a sputtering device as an anti-diffusion layer of the second reflection film 1b, and then a 0.3 µm thick Ti film is formed by using a sputtering device as the anti-reflection film 2. In this way, the reflection film 1 for reflecting both blue and yellow light and the anti-reflection film 2 are formed.

Other than the above, a light emitting device is prepared in the same manner as in Example 1.

What is claimed is:

1. A light emitting device comprising:
   a light emitting element; and
   a wavelength converting member having a first face and a second face, wherein light emitted from the light emitting element enters in through the first face, and a part of the second face serves as a light emitting face,
   wherein the light emitting element further comprises a reflection control structure around the light emitting face of the second face, and the reflection control structure comprises a reflection film on the wavelength converting member and an anti-reflection film on the reflection film.

2. The light emitting device according to claim 1,
   wherein the reflection film comprises a first reflection film and a second reflection film formed on the first reflection film.

3. The light emitting device according to claim 2,
   wherein the first reflection film is a dielectric multilayer.

4. The light emitting device according to claim 2,
   wherein the second reflection film is metal film.

5. The light emitting device according to claim 3,
   wherein the second reflection film is metal film.

6. The light emitting device according to claim 1,
   wherein the light emitting element is a blue light emitting diode and the wavelength converting member comprises YAG phosphor particles.

7. The light emitting device according to claim 2,
   wherein the light emitting element is a blue light emitting diode and the wavelength converting member comprises YAG phosphor particles.

8. The light emitting device according to claim 1, further comprising a light reflecting member which covers a side face of the wavelength converting member.

9. The light emitting device according to claim 2, further comprising a light reflecting member which covers a side face of the wavelength converting member.

10. The light emitting device according to claim 3, further comprising a light reflecting member which covers a side face of the wavelength converting member.

11. The light emitting device according to claim 4, further comprising a light reflecting member which covers a side face of the wavelength converting member.

12. The light emitting device according to claim 5, further comprising a light reflecting member which covers a side face of the wavelength converting member.

13. The light emitting device according to claim 6, further comprising a light reflecting member which covers a side face of the wavelength converting member.

14. The light emitting device according to claim 7, further comprising a light reflecting member which covers a side face of the wavelength converting member.

* * * * *